US008653829B2

(12) United States Patent
Pulijala

(10) Patent No.: US 8,653,829 B2
(45) Date of Patent: Feb. 18, 2014

(54) METHOD AND SYSTEM FOR HIGH GAIN AUTO-ZEROING ARRANGEMENT FOR ELECTRONIC CIRCUITS

(75) Inventor: Srinivas K. Pulijala, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 245 days.

(21) Appl. No.: 13/307,018

(22) Filed: Nov. 30, 2011

(65) Prior Publication Data

US 2013/0134988 A1    May 30, 2013

(51) Int. Cl.
*G01R 35/00* (2006.01)
*G01R 31/00* (2006.01)

(52) U.S. Cl.
USPC ..................... 324/601; 324/750.02; 702/85

(58) Field of Classification Search
USPC .......... 324/601, 74, 202, 750.02, 130; 702/85
See application file for complete search history.

(56) References Cited

U.S. PATENT DOCUMENTS

| 5,180,932 | A  | * | 1/1993 | Bengel .......................... 327/362 |
| 6,032,109 | A  | * | 2/2000 | Ritmiller, III ................. 702/104 |
| 6,400,131 | B1 | * | 6/2002 | Turner .......................... 324/130 |
| 7,642,846 | B2 | * | 1/2010 | Yan .................................. 330/9 |
| 7,760,126 | B2 | * | 7/2010 | Terranova ..................... 341/159 |
| 2010/0238057 | A1 | * | 9/2010 | Wood ............................ 341/124 |

* cited by examiner

*Primary Examiner* — Hoai-An D Nguyen
(74) *Attorney, Agent, or Firm* — King & Spalding L.L.P.

(57) ABSTRACT

A method and system for high gain auto-zeroing arrangement for electronic circuits. An auto-zero electronic circuit eliminates an offset associated with a test electronic circuit. The test electronic circuit includes a pair of input terminals configured to receive an input voltage signal and a pair of output terminals. The auto-zero electronic circuit includes a pair of source followers, and a pair of capacitors coupled to the output terminals of the test electronic circuit for sampling the offset associated with the test electronic circuit. The auto-zero electronic circuit also includes a differential pair coupled to the pair of source followers. A pair of diode-connected transistors, coupled to the differential pair, is configured to generate biasing voltage signals. The biasing voltage signals modulate the control terminals of a pair of input source followers of the test electronic circuit and eliminate the offset associated with the test electronic circuit.

15 Claims, 2 Drawing Sheets

METHOD AND SYSTEM FOR HIGH GAIN AUTO-ZEROING ARRANGEMENT FOR ELECTRONIC CIRCUITS

TECHNICAL FIELD

The present disclosure relates generally to the field of semiconductor circuit design, and more particularly to methods and systems for eliminating offsets associated with electronic circuits.

BACKGROUND

A wide variety of electronic circuits, especially those involving very small input signals, require signal paths with very low offset voltage. The offset voltage varies with temperature, supply voltage, and other process corners.

Many standard electronic applications use system level auto-calibration technique to achieve this low offset. However, the auto-calibration technique requires more complicated and costly hardware and software, and can slow down time-to-market for new products. The electronic applications, alternatively, employ components with low offset and drift performance. The electronic components such as amplifiers, with by far the lowest offset and drift available, share common design architecture: the chopper or auto-zero amplifier type.

Typically, devices used in a comparator have minimum device lengths for faster operation, but this translates into larger mismatches between the differential input pairs and the current mirrors. Moreover, the offset between the current mirrors and the differential input pairs varies with supply voltage, temperature and process corners. Therefore, trimming such offsets is a difficult task. For a comparator that is part of an SAR ADC, any offset translates into a Differential Non-linearity error, and subsequently into an integrated non-linearity error.

Thus, there remains a need for a robust high gain auto-zeroing arrangement to eliminate the mismatches associated with comparators and other electronic circuits.

SUMMARY

Briefly described, and according to one embodiment, the present disclosure describes a method and system for high gain auto-zeroing arrangement for electronic circuits. An auto-zero electronic circuit eliminates an offset associated with a test electronic circuit. The test electronic circuit includes a pair of input terminals configured to receive an input voltage signal and a pair of output terminals. The auto-zero electronic circuit includes a pair of source followers, and a pair of capacitors coupled to the output terminals of the test electronic circuit for sampling the offset associated with the test electronic circuit. The auto-zero electronic circuit also includes a differential pair coupled to the pair of source followers. A pair of diode-connected transistors, coupled to the differential pair, is configured to generate biasing voltage signals. The biasing voltage signals modulate the control terminals of a pair of input source followers of the test electronic circuit and eliminate the offset associated with the test electronic circuit.

According to another embodiment, the present disclosure describes a method for auto-zeroing a test electronic circuit in an auto-zero mode. The method includes coupling an input voltage signal to input terminals of a pair of source followers. The input terminals of the pair of source followers are coupled to the input terminals of the test electronic circuit. The method further includes coupling output terminals of the test electronic circuit to input terminals of a pair of second source followers. Moreover, the method includes sampling an offset voltage associated with the test electronic circuit at the output terminals of the test electronic circuit, and modulating the input terminals of the pair of second source followers by the sampled offset voltage. In addition, the method includes providing signals from the pair of second source followers to a differential pair connected to a pair of diode-connected transistors. The method also includes generating biasing voltage signals from output nodes of the diode-connected transistors, and modulating control terminals of the pair of second source followers by the biasing voltages to eliminate the offset associated with the test electronic circuit.

Figure 1:
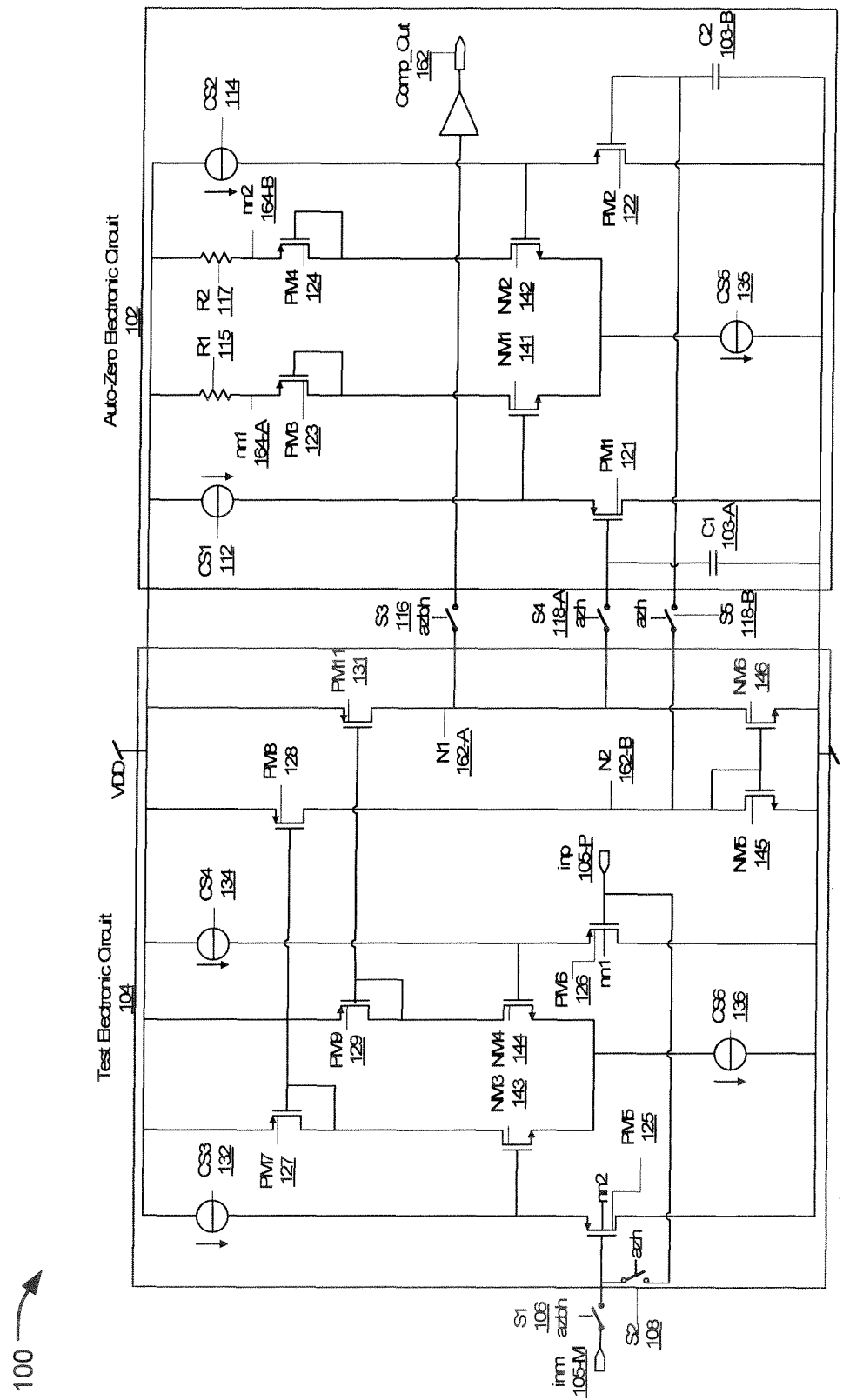
FIG. 1 is a transistor diagram of one embodiment of an auto-zero electronic circuit configured according to principles of the present invention.

While embodiments of the present disclosure are amendable to various modifications and alternative forms, specific embodiments are shown by way of example in the drawings and are described in detail. It should be understood, however, that the drawings and detailed description thereto are not intended to limit the present disclosure to the particular form disclosed, but on the contrary, the intention is to cover all modifications, equivalents, and alternatives falling within the spirit and scope of the present disclosure as defined by the appended claims.

DETAILED DESCRIPTION

The following detailed description is made with reference to the figures. Embodiments are described to illustrate the disclosed system and method, not to limit their scope. With the insight provided by the instant disclosure, those of ordinary skill in the art should recognize a variety of equivalent variations on the description that follows.

Overview

Embodiments of the present disclosure provide a method and system for a high gain auto-zeroing system for electronic circuits. This arrangement removes any offsets associated with these electronic circuits. The electronic circuit is connected to an auto-zero electronic circuit. An input voltage signal is supplied to the input terminals of the electronic circuit, including a pair of source followers. An offset voltage associated with the electronic circuit is sampled at output terminals of the electronic circuit. The sampled voltage modulates a pair of source followers of the auto-zero electronic circuit. The modulated source followers modulate a differential pair of the auto-zero electronic circuit. A voltage difference at the gates of differential pair generates a biasing voltage at the source terminals of diode-connected transistors. The biasing voltage at the source terminals of diode-connected transistors is fed back to the source followers of the electronic circuit, thus, modulating the bulk terminals of the electronic circuit's source followers. As a result, a feedback loop is completed between the output terminals and the input device of the electronic circuit, thus, eliminating the offset associated with the electronic circuit.

An auto-zeroing system includes techniques that remove the input offset of an electronic circuit by measuring the offset, processing the offset to provide the desired feedback, and then eliminating the offset during normal operation. The calibration can be accomplished during manufacturing stages. Alternatively, auto-zeroing can be performed during normal operation, by periodically interrupting the signal path for brief calibrations. Using this technique, the measured voltage is retained for a short time only, allowing use of a capacitor to store the value. The advantage of auto-zeroing during normal operation is that as the offset of the electronic circuit shifts, due to temperature changes, voltage changes or the like, the auto-zeroing can measure the changes and compensate for the offset Exemplary Systems FIG. 1 is a transistor diagram illustrating an exemplary electronic circuit 100 including an auto-zero electronic circuit 102. This circuit eliminates an offset associated with a test electronic circuit 104. The test electronic circuit 104 has a pair of input terminals 105-P and 105-M coupled to a pair of input voltage signals "inm" and "inp", and a pair of output terminals N1 162-A and N2 162-B. The auto-zero electronic circuit 102 includes a first pair of source followers PM1 121 and PM2 122 having a first pair of input terminals coupled to the output terminals N1 162-A and N2 162-B of the test electronic circuit 104. The auto-zero electronic circuit 102 further includes a pair of capacitors C1 103-A and C2 103-B coupled to the first pair of input terminals for sampling the offset associated with the test electronic circuit 104. A differential pair NM1 141 and NM2 142 is coupled to a first pair of output terminals of the first pair of source followers PM1 121 and PM2 122. In addition, a pair of diode-connected transistors PM3 123 and PM4 124, coupled to the differential pair NM1 141 and NM2 142, is configured to generate biasing voltage signals. A pair of resistors R1 115 and R2 117 couples the pair of diode-connected transistors PM3 123 and PM4 124 to a reference voltage VDD. The test electronic circuit 104 includes a second pair of source followers PM5 125 and PM6 126 coupled to the input terminals 105-P and 105-M of the test electronic circuit 104 for receiving the input voltage signals "inm" and "inp". The second pair of source followers PM5 125 and PM6 126 has a pair of control terminals which are configured to receive the biasing voltage signals at the nodes "nn1" 164-A and "nn2" 164-B for eliminating the offset.

As shown in FIG. 1, the source followers PM1 121 and PM2 122 are PMOS transistors with their gate terminals connected to the output terminals N1 162-A and N2 162-B of the test electronic circuit 104. The drains of the source followers PM1 121 and PM2 122 are connected to the ground potential. The source terminals of the source followers PM1 121 and PM2 122 are connected to the gates of the differential pair NM1 141 and NM2 142. The differential pair NM1 141 and NM2 142 are NMOS transistors. Identical capacitors C1 103-A and C2 103-B couple the gate terminals of the source followers PM1 121 and PM2 122 to sample the offset associated with the test electronic circuit 104. On the differential pair NM1 141 and NM2 142, source terminals connect to the current source CS5, and the drain terminals connect to the drain terminals of the diode-connected PMOS transistors PM3 123 and PM4 124.

The biasing voltage potential at the source terminals of the diode-connected transistors PM3 123 and PM4 124 modulates the bulk terminals of PMOS source followers PM5 125 and PM6 126. The gates of the source followers PM5 125 and PM6 126 are coupled to the input terminals 105-M and 105-P respectively, for receiving the input voltage signals "inm" and "inp". Source followers PM5 125 and PM6 126 have their drain terminals connected to ground and the source terminals connected to the reference voltage VDD via current sources CS3 132 and CS4 134. The bulk terminals of the source followers PM5 125 and PM6 126 respectively connect to nodes "nn2" 164-B and "nn1" 164-A to receive the biasing voltage signals, eliminating the offset associated with the test electronic circuit 104.

In the high gain auto-zeroing arrangement, electronic circuit 100 further includes a first switch S1 106 which de-couples the gate of PM5 125 from input terminal 105-M, thus de-coupling the input voltage signal "inm", during an auto-zero mode. A second switch S2 108 couples the two input terminals (gates) of the second pair of source followers PM5 125 and PM6 126 to the second input voltage signal "inp" during the auto-zero mode. A third pair of switches S4 118-A and S5 118-B couples the output terminals N1 162-A and N2 162-B of the test electronic circuit 104 to the first pair of input terminals (gates) of the first pair of source followers PM1 121 and PM2 122. Further, a fourth switch S3 116 de-couples the output terminal N1 162-A of the test electronic circuit 104 to an output port Comp_Out 166 during the auto-zero mode.

The switches S2 108, S4 118-A and S5 118-B are controlled by an auto-zero pulse "azh", and switches 51 106 and S3 116 are controlled by an auto-zero bar pulse "azbh". The auto-zero pulse "azh" and the auto-zero bar pulse "azbh" are non-overlapping clock pulses. Therefore, when the auto-zero pulse "azh" is high, the auto-zero bar pulse "azbh" is low, and vice-versa.

The electronic circuit 100 may operate in an auto-zero mode for eliminating the offset associated with the test electronic circuit 104. In the auto-zero mode, the auto-zero pulse "azh" is in an active high state and the auto-zero bar pulse "azbh" is in a low state. As a result, the first switch S1 106 and the fourth switch S3 116 are in an "off" state, and the second switch S2 108 and the third pair of switches S4 118-A and S5 118-B are in an "on" state. In the "on" state, the switches S2 108, S4 118-A and S5 118-B make the electrical connection, while in the "off" state, the switches S1 106 and S3 116 break the electrical connection.

The mismatch associated with the test electronic circuit 104 for any particular input voltage can be eliminated by performing the high gain auto-zeroing technique. When the high gain auto-zeroing process is to be run on the test electronic circuit 104, the auto-zero pulse "azh" is set high and the auto-zero bar pulse "azbh" is set low. As a result, the gates of the second pair of source followers PM5 125 and PM6 126 are mutually shorted at the particular input voltage supplied via the input terminal 105-P.

Because the auto-zero bar pulse "azbh" is low, the input voltage signal "inm" is disconnected from the gate terminal of the source follower PM5 125. In addition, the output terminal N1 162-A of the test electronic circuit 104 is disconnected from the output port Comp_Out 166. As a result, the output of the test electronic circuit 104 is not transferred to the output port Comp_Out 166 during the auto-zero mode. Further, the high state of the auto-zero pulse "azh" forces switches S4 118-A and S5 118-B to the "on" state. As a result, the output terminals N1 162-A and N2 162-B electrically connect to the first pair of input terminals of the first pair of source followers PM1 121 and PM2 122. In that manner, the offset developed in the test electronic circuit 104, including the offset between the source followers PM5 125 and PM6 126 is sampled on the capacitors C1 103-A and C2 103-B.

Depending on the direction of the offset, the voltage potential at the output terminal N1 162-A or N2 162-B may be higher or lower than the voltage potential at the corresponding output terminal N2 162-B or N1 162-A. The sampled value of offset present on the source followers PM1 121 and PM2 122 modulates the differential pair NM1 141 and NM2 142 as the source terminal of the source followers PM1 121 and PM2 122 are connected to the gate terminal of the differential pair NM1 141 and NM2 142. For instance, if the offset is positive on the source follower PM1 121, the gate of PM1 121 is slightly higher than the gate of PM2 122. This causes the gate of the transistor NM1 141 to be higher than the gate of the transistor NM2 142. As a result, the drain of diode-connected transistor PM3 123 is driven lower than the drain of diode-connected transistor PM4 124. In a differential pair, or in a common source amplifier configuration, the drain terminal would go low if the gate terminal goes high. Thus, the node "nn1" 164-A will go down and node "nn2" 164-B will go up, and the voltage potential at the node "nn1" 164-A will be lower than the voltage potential at the node "nn2" 164-B.

Therefore, the sampled offset on the source followers PM1 121 and PM2 122 modulates the nodes "nn1" 164-A and "nn2" 164-B according to the direction of the offset. The nodes "nn1" 164-A and "nn2" 164-B are connected to the bulk terminals of the source followers PM5 125 and PM6 126. This completes a feedback loop connecting the feedback from the output terminals N1 162-A and N2 162-B of the test electronic circuit 104 to the input devices, source followers PM5 125 and PM6 126 of the same test electronic circuit 104. Based on the direction of the offset, nodes "nn1" 164-A and "nn2" 164-B move accordingly. This causes the bulk terminals of source followers PM5 125 and PM6 126 to be modulated, thus correcting the offset which would be present on the output terminals N1 162-A and N2 162-. The source followers PM5 125 and PM6 126 have no gain associated with them, and therefore the auto-zero electronic circuit 102 involving the source followers PM1 121 and PM2 122, the differential pair NM1 141 and NM2 142 need not have a high gain to correct for the offsets associated with the test electronic circuit 104. The high gain auto-zeroing arrangement yields a high gain by modulating the bulk terminals of the input devices, source followers PM5 125 and PM6 126, of the test electronic circuit 104.

The electronic circuit 100 may operate in a normal mode when the offset associated with the test electronic circuit 104 has been eliminated or when the electronic circuit 100 is not operating in the auto-zero mode. In the normal mode, the auto-zero pulse "azh" is in a low state and the auto-zero bar pulse "azbh" is in a high state. As a result, the first switch S1 106 and the fourth switch S3 116 are in an "on" state, and the second switch S2 108 and the third pair of switches S4 118-A and S5 118-B are in an "off" state. In the "on" state, the switches S1 106 and S3 116 make the electrical connection, and in the "off" state, the switches S2 108, S4 118-A and S5 118-B break the electrical connection. As a result, the gates of the second pair of source followers PM5 125 and PM6 126 are not mutually short circuited.

The gates of source followers PM5 125 and PM6 126 are connected to the input voltage signals "inm" and "inp" respectively, supplied via the input terminals 105-M and 105-P. Further, the output terminal N1 162-A of the test electronic circuit 104 is connected to the output port Comp_Out 166, resulting in transferring the output of the test electronic circuit 104 to the output port Comp_Out 166 during normal mode operation. In addition, the low state of the auto-zero pulse "azh" drives switches S4 118-A and S5 118-B to the "off" state. As a result, the output terminals N1 162-A and N2 162-B of the test electronic circuit 104 are disconnected from the first pair of input terminals of the first pair of source followers PM1 121 and PM2 122 of the auto-zero electronic circuit 102.

The electronic circuit 100 may be operated by initially auto-zeroing the test electronic circuit 104, thus eliminating all kinds of offsets associated with the test electronic circuit 104. The test electronic circuit 104 can then perform the desired operation in the normal mode. For example, when the test electronic circuit 104 is a comparator, the comparator is initially run in the auto-zero mode to remove the offset associated with the comparator. In an instance, when the input signals have a difference of 2 millivolts and the comparator is designed to trip at that difference, the comparator will trip without any offset. The output will be transferred to the Comp_Out port 166 indicating the tripping point.

In one embodiment, the auto-zero electronic circuit 102 may further include a first pair of current sources CS1 112 and CS2 114 coupled between the first pair of output terminals of the first pair of source followers PM1 121 and PM2 122 and the reference voltage VDD. The auto-zero electronic circuit 102 may also include a current source CS5 135 coupling source terminal of the differential pair NM1 141 and NM2 142 to the ground potential.

In an embodiment, the test electronic circuit 104 may include a comparator. Therefore, the high gain auto-zeroing arrangement may be used to eliminate the offset associated with the comparator.

In another embodiment, the test electronic circuit 104 may further include a differential pair NM3 143 and NM4 144 including a fifth pair of input terminals coupled to the second pair of output terminals of the second pair of source followers PM5 125 and PM6 126. A first pair of current mirrors PM7 127 and PM8 128, and PM9 129 and PM11 131 is coupled between the fifth pair of output terminals of the differential pair NM3 143 and NM4 144, respectively, and the reference voltage VDD. The test electronic circuit 104 may further include a third current mirror NM5 145 and NM6 146 coupled to a pair of output terminals of the first pair of current mirrors PM7 127 and PM8 128, and PM9 129 and PM11 131. The third current mirror NM5 145 and NM6 146 also couples to the pair of output terminals N1 162-A and N2 162-B of the test electronic circuit 104. The test electronic circuit 104 may also include a second pair of source followers CS3 132 and CS4 134 coupled between the fifth pair of output terminals of the second pair of source followers PM5 125 and PM6 126 and the reference voltage VDD. A current source CS6 136 couples the source terminal of the differential pair NM3 143 and NM4 144 to the ground potential.

Therefore, the offset developed in the test electronic circuit 104 including the offset due to the source followers PM5 125 and PM6 126, the differential pair NM3 143 and NM4 144, the current mirror PM7 127 and PM8 128, the current mirror PM9 129 and PM11 131, and the current mirror NM5 145 and NM6 146 along with the voltage potential between the gate and source terminals (Vgs) of the NMOS NM6 146 may be sampled on the capacitors C1 103-A and C2 103-B. The sampled offset may thus be eliminated by the auto-zero electronic circuit 102 using the high gain auto-zeroing arrangement.

The high gain auto-zeroing arrangement yields a high gain by modulating the bulk terminals of the input devices—that is, source followers PM5 125 and PM6 126. The source followers PM5 125 and PM6 126 actually have no substantial gain associated with them, thus they do not contribute appreciably to the overall gain. On modulating the bulk inputs of source followers PM5 125 and PM6 126, the gates of the differential pair NM3 143 and NM4 144 are modulated. The differential pair NM3 143 and NM4 144 contributes to the gain of the test electronic circuit 104, and thus that modulation yields a high gain. Thus, the auto-zero electronic circuit 102 involving the source followers PM1 121 and PM2 122, the differential pair NM1 141 and NM2 142 need not have a high gain to correct for the offsets associated with the test electronic circuit 104. The high gain auto-zeroing arrangement yields a high gain by modulating the gates terminals of the differential pair NM3 143 and NM4 144 of the test electronic circuit 104.

It will be understood that though embodiments of the present disclosure may be described using PMOS or NMOS transistors, the embodiments of this disclosure are not restricted to MOS transistors. The embodiments may, just as easily, be incorporated in a high gain auto-zeroing arrangement without departing from the scope of the present disclosure.

Exemplary Methods

Figure 2:
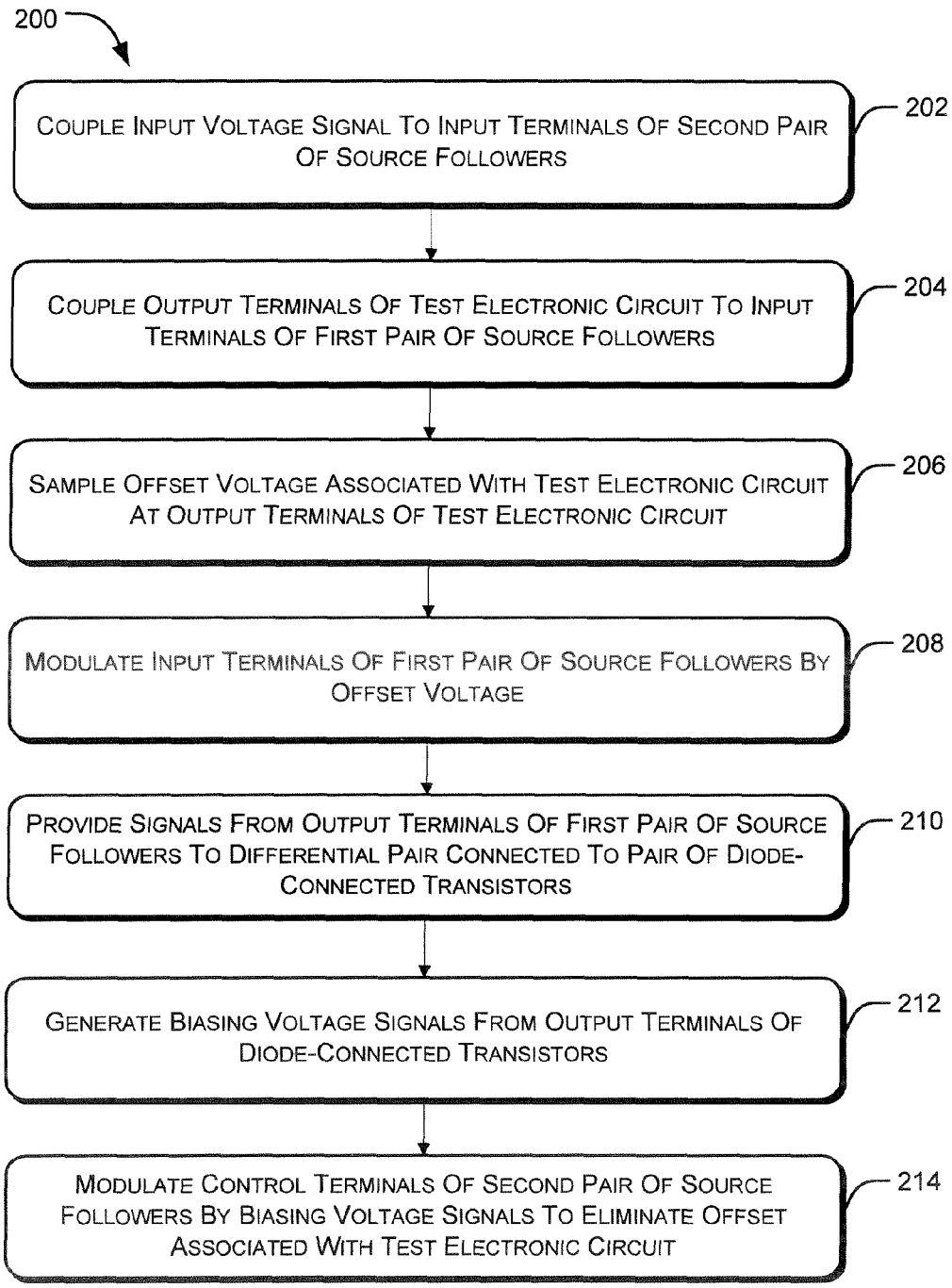
FIG. 2 is a flowchart depicting an exemplary method for auto-zeroing a test electronic circuit.

FIG. 2 is a flowchart depicting an exemplary method for auto-zeroing a test electronic circuit. The method 200 illustrated in FIG. 2 may be used in conjunction with any of the systems or devices shown in the previously described figures, among other devices. In various embodiments, some of the method steps shown may be performed concurrently, or in a different order, or they may be omitted altogether. Additional method steps may be performed as desired. As shown, the method 200 may operate as follows.

At step 202, the input voltage signal "inp" is coupled to the input terminals of the second pair of source followers PM5 125 and PM6 126. At the same time, input terminals of the second pair of source followers PM5 125 and PM6 126 are coupled to the input terminals of the test electronic circuit 104, and gate terminals of PM5 125 and PM6 126 are shorted and connected to the input voltage signal "inp".

The electronic circuit 100 may operate in an auto-zero mode for eliminating the offset associated with the test electronic circuit 104. In the auto-zero mode, the auto-zero pulse is in an active high state and the auto-zero bar pulse is in a low state. The switch S2 108, controlled by the auto-zero pulse "azh", is driven to an "on" state, and at the same time switch S1 106, controlled by an auto-zero bar pulse "azbh", is driven in an "off" state. In the "on" state, the switch S2 108 makes the electrical connection while in the "off" state, the switch S1 106 breaks the electrical connection. Therefore, the test electronic circuit 104 is driven at a desired voltage, at which the offset has to be eliminated, by providing the desired voltage as the input signal "inp". As a result, the offset developed in the test electronic circuit 104 is present on the output terminals N1 162-A and N2 162-B of the test electronic circuit 104.

At step 204, the output terminals N1 162-A and N2 162-B of the test electronic circuit 104 are coupled to the input terminals of the first pair of source followers PM1 121 and PM2 122. In the auto-zero mode, the switches S4 118-A and S5 118-B, controlled by the auto-zero pulse "azh", are driven to an "on" state; at the same time, switch S3 116, controlled by an auto-zero bar pulse "azbh", is driven to an "off" state. Similarly, switches S4 118-A and S5 118-B make the electrical connection in the "on" state, while switch S3 116 breaks the electrical connection in the "off" state. Therefore, the test electronic circuit 104 is driven at a desired voltage, at which the offset is eliminated, by providing the desired voltage as the input signal "inp". As a result, the output terminals N1 162-A and N2 162-B are connected to the gate terminals of the source followers PM1 121 and PM2 122. In addition, the output terminal N1 162-A is disconnected from the output port Comp_Out 166. As a result, the output of the test electronic circuit 104 is not transferred to the output port Comp_Out 166 during the auto-zero mode.

At step 206, the capacitors C1 103-A and C2 103-B sample an offset voltage associated with the test electronic circuit 104. That sampling is made at output terminals N1 162-A and N2 162-B. Next, at step 208, the sampled offset voltage modulates the input terminals of the first pair of source followers PM1 121 and PM2 122. The gate terminals of the source followers PM1 121 and PM2 122 are coupled to identical capacitors C1 103-A and C2 103-B, which present the offset voltage across the gate terminals of the source followers PM1 121 and PM2 122 respectively. That step, results in modulating PM1 121 and PM2 122.

At step 210, the output terminals of the source followers PM1 121 and PM2 122 provide signals to the differential pair NM1 141 and NM2 142. The differential pair NM1 141 and NM2 142 is coupled to the output terminals of the source followers PM1 121 and PM2 122. The source terminals of PM1 121 and PM2 122 are connected to the gates of the differential pair NM1 141 and NM2 142. In addition, the pair of diode-connected transistors PM3 123 and PM4 124 is coupled to the differential pair NM1 141 and NM2 142, configured to generate biasing voltage signals.

At step 212, the diode-connected transistors PM3 123 and PM4 124 generate the biasing voltage signals. The drain terminals of the differential pair NM1 141 and NM2 142 are connected to the drain terminals of the diode-connected transistors PM3 123 and PM4 124. The gate terminals of the differential pair NM1 141 and NM2 142 are also connected to the reference voltage VDD via current sources CS1 112 and CS2 114. The source terminals of the diode-connected transistors PM3 123 and PM4 124 are connected to the reference voltage VDD using resistors R1 115 and R2 117.

Depending on the direction of the offset, the voltage potential at the output terminal N1 162-A or N2 162-B may be higher or lower than the voltage at the corresponding output terminal N2 162-B or N1 162-A. The sampled value of offset present on the source followers PM1 121 and PM2 122 modulates the differential pair NM1 141 and NM2 142, and the source terminals of the source followers PM1 121 and PM2 122 connects to the gate terminal of the differential pair NM1 141 and NM2 142 respectively. For instance, if the offset is positive on the source follower PM1 121, the gate of PM1 121 is slightly higher than the gate of PM2 122. That state causes the gate of the transistor NM1 141 to be higher than the gate of the transistor NM2 142. As a result, the drain of diode-connected transistor PM3 123 is driven lower than the drain of diode-connected transistor PM4 124. In a differential pair or a common source amplifier configuration, if the gate terminal goes high, the drain terminal goes low. Thus, the node "nn1" 164-A will go down and node "nn2" 164-B will go up, and the voltage potential at the node "nn1" 164-A will be lower than the voltage potential at the node "nn2" 164-B.

At step 214, the biasing voltage generated at the nodes "nn1" 164-A and node "nn2" 164-B modulates the control terminals of the second pair of source followers PM5 125 and PM6 126 to eliminate the offset associated with the test electronic circuit 104. The sampled offset on the source followers PM1 121 and PM2 122 modulates the nodes "nn1" 164-A and "nn2" 164-B according to the direction of the offset. The nodes "nn1" 164-A and "nn2" 164-B are connected to the bulk terminals of the source followers PM5 125 and PM6 126. This completes a feedback loop connecting the feedback from the output terminals N1 162-A and N2 162-B of the test electronic circuit 104 to the input devices, source followers PM5 125 and PM6 126 of the same test electronic circuit 104. Based on the direction of the offset, nodes "nn1" 164-A and "nn2" 164-B move accordingly. This causes the bulk terminals of source followers PM5 125 and PM6 126 to be modulated, thus, correcting the offset which would be present on the output terminals N1 162-A and N2 162-B of the test electronic circuit 104. The high gain auto-zeroing arrangement yields a high gain by modulating the bulk terminals of the input devices, source followers PM5 125 and PM6 126, of the test electronic circuit 104.

In another embodiment, the test electronic circuit 104 may operate in the normal mode by performing the following steps in addition to the steps of the method 200.

In the normal mode, the auto-zero pulse "azh" is in a low state and the auto-zero bar pulse "azbh" is in a high state. As a result, the first switch S1 106 and the fourth switch S3 116 are in an "on" state, and the second switch S2 108 and the third pair of switches S4 118-A and S5 118-B are in an "off" state. In the "on" state, the switches S1 106 and S3 116 make the electrical connection whereas, in the "off" state, the switches S2 108, S4 118-A and S5 118-B break the electrical connection.

As a result, the input terminals of the second pair of source followers PM5 125 and PM6 126 are uncoupled. The gates of the source followers PM5 125 and PM6 126 are not mutually shorted.

A pair of input voltage signals "inm" and "inp" is provided to the input terminal of the second pair of source followers PM5 125 and PM6 126. The gates of source followers PM5 125 and PM6 126 are connected to the input voltage signals "inm" and "inp" respectively supplied via the input terminals 105-M and 105-P.

The low state of the auto-zero pulse "azh" causes the switches S4 118-A and S5 118-B to be in an "off" state. As a result, the output terminals N1 162-A and N2 162-B of the test electronic circuit 104 are uncoupled from the input terminals of the first pair of source followers PM1 121 and PM2 122.

Further, the output terminal N1 162-A of the test electronic circuit 104 is connected to the output port Comp_Out 166. As a result, the output of the test electronic circuit 104 is transferred to the output port Comp_Out 166 during the normal mode.

The methods and systems discussed in the present disclosure provide techniques to eliminate the offset associated with electronic circuits in a robust manner. The disclosed techniques present a high gain low offset auto-zeroing arrangement with a low quiescent current. The high gain auto-zeroing arrangement does not mandate a need for a large amount of current flowing through the electronic circuit. Further, the disclosed methods and systems may be used to accurately and reliably measure and remove offsets associated with electronic circuits at varying values of supply voltage, temperature and other process corners.

Those in the art will understand that the steps set out in the discussion above may be combined or altered in specific adaptations of the disclosure. The illustrated steps are set out to explain the embodiment shown, and it should be anticipated that ongoing technological development will change the manner in which particular functions are performed. These depictions do not limit the scope of the present disclosure, which is determined solely by reference to the appended claims.

What is claimed is:

1. An auto-zero electronic circuit for eliminating an offset associated with a test electronic circuit having: a pair of input terminals coupled to a pair of input voltage signals, and a pair of output terminals, the auto-zero electronic circuit comprising:
    a first pair of source followers having: a first pair of input terminals coupled to the pair of output terminals of the test electronic circuit, and a first pair of output terminals;
    a pair of capacitors coupled to the first pair of input terminals for sampling the offset associated with the test electronic circuit;
    a differential pair having: a third pair of input terminals coupled to the first pair of output terminals and a third pair of output terminals;
    a pair of diode-connected transistors having: a fourth pair of input terminals coupled to the third pair of output terminals, and a fourth pair of output terminals configured to generate biasing voltage signals; and
    a pair of resistors coupled between the fourth pair of output terminals and a reference voltage; wherein
    the test electronic circuit includes a second pair of source followers having: a second pair of input terminals coupled to the pair of input terminals of the test electronic circuit for receiving the pair of input voltage signals, and a pair of control terminals configured to receive the biasing voltage signals eliminating the offset.

2. The auto-zero electronic circuit of claim 1, wherein the second pair of source followers includes a pair of transistors.

3. The auto-zero electronic circuit of claim 2, wherein the pair of control terminals of the second pair of source followers includes bulk terminals of the pair of transistors.

4. The auto-zero electronic circuit of claim 1, wherein the test electronic circuit includes a comparator.

5. The auto-zero electronic circuit of claim 1, further comprising:
    a first switch coupling an input terminal of the second pair of input terminals to a first input voltage signal from the pair of input voltage signals;
    a second switch coupling the second pair of input terminals to a second input voltage signal from the pair of input voltage signals;
    a third pair of switches coupling the pair of output terminals of the test electronic circuit to the first pair of input terminals; and
    a fourth switch coupling an output terminal of the test electronic circuit to an output port.

6. The auto-zero electronic circuit of claim 5, operable in an auto-zero mode, wherein, in the auto-zero mode, the first switch and the fourth switch are in an "off" state, and the second switch and the third pair of switches are in an "on" state.

7. The auto-zero electronic circuit of claim 5, operable in a normal mode, wherein, in the normal mode, the first switch and the fourth switch are in an "on" state, and the second switch and the third pair of switches are in an "off" state.

8. The auto-zero electronic circuit of claim 5, wherein the second switch and the third pair of switches are controlled by an auto-zero pulse, and the first switch and the fourth switch are controlled by an auto-zero bar pulse.

9. The auto-zero electronic circuit of claim 8, wherein the auto-zero pulse and the auto-zero bar pulse are non-overlapping clock pulses.

10. The auto-zero electronic circuit of claim 1, further comprising a first pair of current sources coupled between the first pair of output terminals and the reference voltage.

11. The auto-zero electronic circuit of claim 1, wherein the test electronic circuit further comprises:
    a differential pair having: a fifth pair of input terminals coupled to the second pair of source followers, and a fifth pair of output terminals;
    a first pair of current mirrors coupled between the fifth pair of output terminals and the reference voltage, the first pair of current mirrors having a sixth pair of output terminals; and a third current mirror coupled to the sixth pair of output terminals and the pair of output terminals of the test electronic circuit.

12. The auto-zero electronic circuit of claim 11, further comprising a second pair of current sources coupled between the fifth pair of output terminals and the reference voltage.

13. A method for auto-zeroing a test electronic circuit in an auto-zero mode, the method comprising:
- coupling an input voltage signal to input terminals of a second pair of source followers, wherein the input terminals of the second pair of source followers are coupled to the input terminals of the test electronic circuit;
- coupling output terminals of the test electronic circuit to input terminals of a first pair of source followers;
- sampling an offset voltage associated with the test electronic circuit at the output terminals of the test electronic circuit;
- modulating input terminals of the first pair of source followers by the offset voltage;
- providing signals from output terminals of the first pair of source followers to a differential pair connected to a pair of diode-connected transistors;
- generating biasing voltage signals from output terminals of the pair of diode-connected transistors; and
- modulating control terminals of the second pair of source followers by the biasing voltage signals to eliminate an offset associated with the test electronic circuit.

14. The method of claim 13, wherein modulating the control terminals of the second pair of source followers includes modulating bulk terminals of the second pair of source followers.

15. The method of claim 13 for operating the test electronic circuit in a normal mode, the method further comprising:
- uncoupling the input terminals of the second pair of source followers from each other;
- providing a pair of input voltage signals to the input terminal of the second pair of source followers;
- uncoupling the output terminals of the test electronic circuit from the input terminals of the first pair of source followers; and
- coupling an output terminal of the test electronic circuit to an output port.

* * * * *